US006954060B1

(12) United States Patent
Edel

(10) Patent No.: US 6,954,060 B1
(45) Date of Patent: Oct. 11, 2005

(54) A-C CURRENT TRANSFORMER FUNCTIONAL WITH A D-C CURRENT COMPONENT PRESENT

(76) Inventor: Thomas G. Edel, 9232 N. Tyler Ave., Portland, OR (US) 97203-2356

( * ) Notice: Subject to any disclaimer, the term of this patent is extended or adjusted under 35 U.S.C. 154(b) by 220 days.

(21) Appl. No.: 10/401,921

(22) Filed: Mar. 28, 2003

(51) Int. Cl.[7] .............................................. G01R 31/06
(52) U.S. Cl. .................................. 324/117 R; 324/547
(58) Field of Search .............................. 324/547, 103 R, 324/110, 13 R, 141, 142, 74, 76.12, 117 R; 379/106.03; 702/65, 57, 60, 62

(56) References Cited

U.S. PATENT DOCUMENTS

| | | | |
|---|---|---|---|
| 2,428,613 A | 10/1947 | Boyajian | |
| RE28,851 E | 6/1976 | Milkovic | |
| 4,255,704 A | 3/1981 | Milkovic | |
| 4,255,705 A | 3/1981 | Milkovic | |
| 4,278,940 A | 7/1981 | Milkovic | |
| 4,513,274 A | 4/1985 | Halder | |
| 4,616,174 A | 10/1986 | Jorgensen | |
| 4,885,675 A | * 12/1989 | Henze et al. | ................. 363/26 |
| 4,912,396 A | 3/1990 | Groenenboom | |
| 5,150,270 A | 9/1992 | Ernst et al. | |
| 5,563,506 A | 10/1996 | Fielden et al. | |
| 5,811,965 A | 9/1998 | Gu | |
| 6,028,422 A | 2/2000 | Preusse | |
| 6,072,310 A | 6/2000 | Krebs et al. | |
| 6,522,517 B1 | 2/2003 | Edel | |
| 6,535,000 B2 * | 3/2003 | Shuey | ........................ 324/547 |

\* cited by examiner

Primary Examiner—David Zarneke
Assistant Examiner—Trung Q. Nguyen

(57) ABSTRACT

The magnetic core of an a-c current transformer is optimized so that the current transformer is able to function with a primary electric current having a d-c current component. In the preferred embodiment, the magnetic core is optimized to have nonlinear incremental permeance so that the magnetic core operates with high incremental permeance when the d-c current component is not present (thereby providing current transformer operation with relatively high accuracy), and the magnetic core operates in a non-saturated manner with reduced incremental permeance when the d-c current component is present (thereby providing acceptable current transformer operation, but with reduced accuracy). An electronic assist means may be provided for improved current transformer accuracy. An alternate embodiment combines an electronic assist means together with a magnetic core that has low permeance.

16 Claims, 7 Drawing Sheets

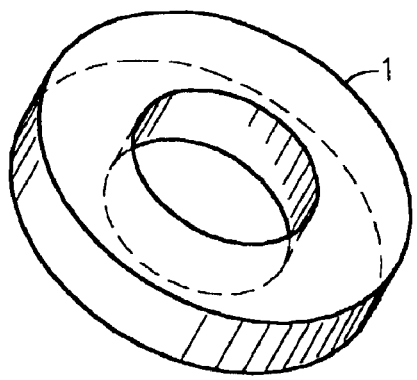
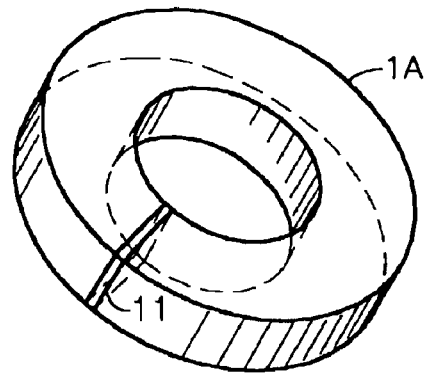
PRIOR ART
FIG. 8
PRIOR ART
FIG. 9
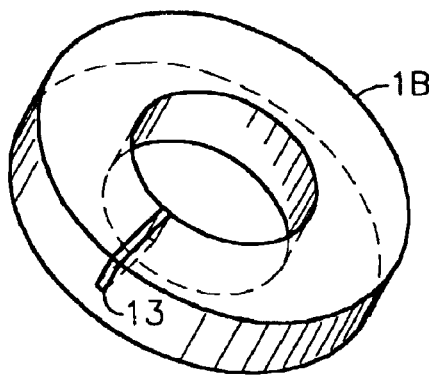
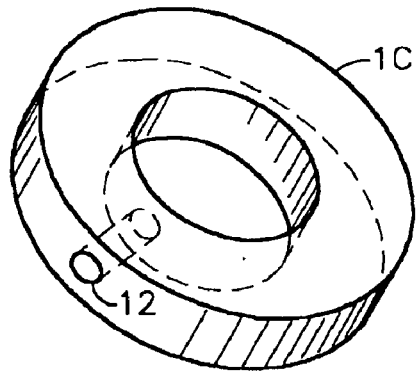
FIG. 10
FIG. 11
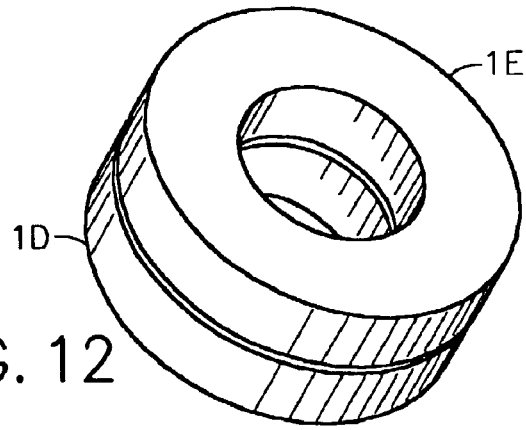
FIG. 12

A-C CURRENT TRANSFORMER FUNCTIONAL WITH A D-C CURRENT COMPONENT PRESENT

CROSS-REFERENCE TO RELATED APPLICATION

Not Applicable.

STATEMENT REGARDING FEDERALLY SPONSORED RESEARCH

Not Applicable.

REFERENCE TO A MICROFICHE APPENDIX

Not Applicable.

BACKGROUND OF THE INVENTION

This invention relates to the measurement of electric current in a non-contact manner utilizing current transformers. More particularly, the invention relates to the use of current transformers to measure a-c (alternating-current) electric current in the case of a d-c (direct-current) electric current component also being present. One important application is in electric energy metering, providing a way to improve current transformer accuracy in the presence of a d-c current component, thereby improving the accuracy of the energy meter.

Most current monitoring systems for a-c electric power systems utilize ordinary current transformers to provide input currents that are isolated from the electric power system conductors, similar to FIG. 1. A current-carrying conductor 4 is configured as a primary winding of a current transformer CT1, and is magnetically coupled to a magnetic core 1. For clarification, the term "magnetic core" as used herein refers to a magnetic body having a defined relationship with one or more conductive windings. A secondary winding 2 is also magnetically coupled to magnetic core 1. The phrase "magnetically coupled" is intended to mean that flux changes in a magnetic body are associated with an induced voltage in the winding, the induced voltage being proportional to the rate of change of magnetic flux that is coupled, in accordance with Faraday's Law.

A secondary electric current J2 is induced in the secondary winding and is approximately proportional to a primary electric current J1. The secondary current is isolated from the primary current and is smaller than the primary current by the turns ratio of the primary and secondary windings. The primary winding may consist of only one turn (as in FIG. 1) or may have multiple turns wrapped around the magnetic core. The secondary winding usually consists of multiple turns wrapped around the magnetic core. If the current transformer had ideal properties, the secondary current would be instantaneously and precisely proportional to the primary current. However, since magnetic cores with ideal properties are not known, the current transformer is subject to a substantial error of ratio, phase-angle, and/or wave-shape in its output as a function of (a) properties of the magnetic core,
(b) its burden, and
(c) a d-c component of the primary current.

(The "output" of a current transformer is usually considered to be its secondary current). The impact that each of these items has on current transformer accuracy will now be discussed briefly.

The magnetic core of a current transformer plays an important part in determining current transformer accuracy. Current transformer accuracy is usually acted by the coercive force of the magnetic core material (less is better), the cross sectional area of the magnetic core (bigger is better), the effective magnetic length of the magnetic core (shorter is better), any air gap in the magnetic core (less or none is usually better), and the "squareness" of the magnetic core material hysteresis curve (squarer may be preferred if not operating near saturation, otherwise characteristics that are not square may be preferred). Split-core current transformer cores generally have hysteresis curves that are less square than standard current transformer cores due to the small air gaps inherent in the design of split-core current transformers.

Additionally, the permeability of the magnetic core material is important. Permeability is usually defined as a ratio of magnetic flux density (B) to magnetic field strength (H). In the absence of a d-c current component, current transformer accuracy normally improves as the permeability of the magnetic core material increases. For purposes of this disclosure, several types of permeability are significant. "Normal permeability" refers to the simple ratio of B/H at any specified point on a hysteresis curve. "Initial permeability" refers to the ratio of B/H at very small magnitudes of H (usually tested after the material has been demagnetized). "Incremental permeability" refers to the ratio of a change of magnetic flux density relative to a small change of magnetic field strength ($\Delta B/\Delta H$) at any specified location on a hysteresis curve.

While the permeability of magnetic core material is an important factor in current transformer accuracy, it is equally important how the magnetic core is constructed. Current transformer accuracy is dependent on the properties of the total magnetic core configuration, not just the magnetic material that the core is made with. While "permeability" is an important parameter of the magnetic material, "permeance" is an important parameter of the magnetic core. Permeance is usually defined as a ratio of magnetic flux ($\Phi$) (through a cross-section of a magnetic circuit) to magnetomotive force (F). Permeance is the reciprocal of reluctance. In the absence of a d-c current component, current transformer accuracy normally improves as the permeance of the magnetic core increases. For purposes of this disclosure, several types of permeance are significant. "Normal permeance" refers to the simple ratio of $\Phi/F$ at any specified point on a hysteresis curve. "Initial permeance" refers to the ratio of $\Phi/F$ at very small magnitudes of F (usually tested after the magnetic core has been demagnetized). "Incremental permeance" refers to the ratio of a change of magnetic flux relative to a small change of magnetomotive force ($\Delta\Phi/\Delta F$) at any specified location on a hysteresis curve.

Current transformer accuracy is also affected by the burden of the current transformer secondary circuit. In order for the secondary current generated by a current transformer to be an accurate representation of the primary current, the impedance of the circuit connected to the secondary winding must be kept low so that current can flow freely. The impedance of the secondary circuit is often called the "burden." The burden generally includes all impedances in the loop through which the secondary current flows, including stray winding impedances, stray impedances of connecting conductors, and the impedances of any devices connected in the loop (such as current-sensing resistors and relay operating coils). In order for a current transformer to drive a secondary current through a non-zero burden, a voltage must be induced in the secondary winding. The induced voltage is proportional to secondary current and is proportional to the burden, in accordance with Ohm's Law (the induced voltage equals the secondary current times the vector sum of all secondary loop impedances). The induced voltage is induced in the secondary winding by a fluctuating magnetic flux in the magnetic core, the instantaneous magnitude of induced voltage being proportional to the rate of change of magnetic flux, in accordance with Faraday's Law. The fluctuating magnetic flux is associated with an "exciting current" in accordance with well-known electromagnetic principles. The exciting current is often understood to have a magnetizing component and a core loss component. When utilized to measure alternating current with no d-c component, the exciting current accounts for the error in the secondary current, and may be referred to herein as an "exciting current error." Generally speaking, the accuracy of a current transformer is inversely related to the burden of the secondary circuit. A higher burden causes the current transformer to operate with greater induced voltage, thereby increasing the exciting current error, thereby causing the secondary current to be less accurately proportional to the primary current.

Current transformer accuracy is also affected by a d-c current component that may be present in the primary current. A d-c current component causes the magnetic core to experience a large magnetomotive force, which can cause the core to saturate, and thereby cause severe distortion of the secondary current. For clarity, magnetomotive force will now be discussed briefly.

Magnetomotive force (F) is associated with the art of magnetic circuits, and is often defined for a closed loop as the line integral of the magnetic field strength (H) around the closed loop:

$$F = \oint H \cdot dl$$

Magnetomotive force F is a scalar quantity associated with the closed loop, while magnetic field strength H is a vector quantity. By Ampere's Law, magnetomotive force is proportional to the total current flowing through the closed loop. Utilizing the meter-kilogram-second (m.k.s.) system of units, magnetomotive force has units of amperes (or amp-turns), and is equal to the total current flowing through the closed loop. The closed loop is often chosen to pass through one or more conductive windings wrapped around a magnetic body, and a magnetomotive force equal to the current in the winding times the number of winding turns is associated with each winding (thus the unit "amp-turns"). The total instantaneous magnitude of magnetomotive force for the closed loop is the instantaneous sum of magnetomotive force contributions from all windings and other conductors that pass through the closed loop.

Many magnetic devices operate best with an average magnetomotive force near zero. A deviation away from zero often results in excessive buildup of magnetic flux that causes the device to malfunction. Ordinary current transformers are one type of device for which this is usually the case.

With preferred current transformer operation, the amp-turns of the primary winding are largely canceled by the amp-turns of the secondary winding, so that the magnetomotive force acting on the current transformer core is relatively small. The net magnetomotive force acting on the core is equal to the sum (or difference, depending on polarity conventions) in amp-turns of the primary winding and the secondary winding, and this sum is proportional to a secondary current error.

Speaking more precisely of current transformer operation, a secondary electric current error is proportional to the magnetomotive force acting on the magnetic core. The instantaneous value of the magnetomotive force is equal to the instantaneous sum of the primary electric current multiplied by the number of turns of the primary winding and the secondary electric current multiplied by the number of turns of the secondary winding (with the primary current and secondary current having opposite polarities so that their magnetomotive force contributions tend to cancel each other). The secondary electric current error comprises a d-c component and an a-c component; the d-c component will be referred to as a d-c current error, and the a-c component will be referred to as an exciting current error.

Ordinary current transformers work properly only with alternating primary current. When a d-c component is present in the primary current, normal current transformer operation cannot maintain a d-c component in the secondary circuit, and a large d-c current error results. This d-c current error correlates to a large d-c magnetomotive force applied to the magnetic core, which causes the magnetic core to saturate, thereby adversely affecting current transformer operation.

A great many variations to the basic current transformer circuit have been developed in the prior art to improve current transformer accuracy for various applications. Some of these are summarized here:

(a) Utilize an active load to sense current. An active load can have an effective burden of virtually zero Ohms, but this does not solve the problem of stray impedances contributing to the burden of the secondary circuit. The use of an active load to reduce current transformer burden is described in detail in U.S. Pat. No. Re. 28,851 to Milkovic (reissued 1976) for a "Current Transformer with Active Load Termination."

(b) FIG. 2 illustrates a prior-art "zero-flux" current transformer. This is one form of a current transformer having an electronic assist means. A sense winding 10 terminated in a high-impedance manner provides a voltage signal V4 that is proportional to the rate of change of magnetic flux. By amplifying this signal and applying it in series with the secondary winding, the effective burden of the entire secondary circuit is reduced to near zero ohms. Magnetic flux changes in the current transformer core are reduced to near zero, and the exciting current required is reduced to near zero, thereby making secondary current more accurately proportional to primary current. The amplifier essentially provides the driving voltage necessary to drive loop current through secondary loop impedances so that the current transformer core does not need to generate this voltage via a changing flux. Higher gains in the amplifier circuit contribute to increased accuracy and smaller flux changes, though excessively high gain typically leads to instability and associated oscillations. This device provides very good accuracy for measurement of a-c current, but measurement accuracy is significantly reduced by the presence of a d-c current component in the primary current.

(c) In order to measure currents with d-c components, Hall-effect current sensors are often used. These sensors typically insert a Hall-effect magnetic field sensor in a current transformer core air gap. In "open loop" devices, the magnetic field strength is used to estimate the primary current directly. "Closed loop" devices utilize a zero-flux concept similar to that described for FIG. 2. However, instead of using a sense winding (as in FIG. 2), the Hall-effect element generates a voltage signal proportional to the magnetic field in the air gap.

A high-gain amplifier circuit is used to drive secondary current to continuously nullify the magnetic field, which causes the secondary winding amp-turns to balance the primary winding amp-turns. This results in a secondary current that is proportional to the primary current. A current-sensing resistor in the secondary circuit normally provides a voltage signal that is proportional to secondary current. While these Hall-effect current sensors are widely used, their accuracy and stability over time are not adequate for many applications.

(d) FIG. 3 shows another prior-art current transformer circuit that operates with an electronic assist means. This type of "burden-reducing" circuit is described in U.S. Pat. No. 6,522,517 by Edel. This patent in its entirety is hereby incorporated by reference into this disclosure.

The circuit shown in FIG. 3 uses the secondary current as an input to generate the compensation voltage required to drive secondary current (voltage V1 is proportional to secondary current J2, and is used as an information signal to produce output voltage V3). This circuit has the advantage of utilizing ordinary current transformers without the need for a sense winding or Hall-effect sensor. However, the circuit shown in FIG. 3 can only be used to measure a-c current. The associated patent describes how the control circuit can be modified to enable accurate measurement of current with a d-c current component, but the method used is dependent on brief periodic reset pulses applied to the magnetic core, during which time current cannot be measured.

(e) Many specialized current transformers with multiple windings and multiple cores have been developed. Many of these transformers have excellent accuracy. However, most of these specialized transformers are prohibitively expensive for many applications. Some devices having simple magnetic cores drive the core in and out of saturation to measure d-c current, often causing excessive noise on the primary circuit.

It is therefore an object of the present invention to provide an economical current sensor with the following properties:

(a) Provide an a-c current transformer that has good accuracy even with the presence of a d-c component in the primary current.

(b) Utilize a relatively simple and inexpensive magnetic core.

(c) Have a high degree of stability over time and temperature.

(d) Not cause noise on the primary circuit.

Other objects and advantages will become apparent from the description of the invention.

BRIEF SUMMARY OF THE INVENTION

The magnetic core of an a-c current transformer is optimized so that the current transformer is able to function with a primary electric current having a d-c current component. In the preferred embodiment, the magnetic core is optimized to have nonlinear incremental permeance so that (a) the magnetic core operates with high incremental permeance when the d-c current component is not present, thereby providing current transformer operation with relatively high accuracy;

(b) the magnetic core does not saturate when the d-c current component is present; and (c) the magnetic core operates in a non-saturated manner with reduced incremental permeance when the d-c current component is present, thereby providing acceptable current transformer operation, but with reduced accuracy.

One way to optimize the magnetic core is to construct it so that a first part of the magnetic core comprises a first kind of magnetic material having relatively high permeability, with this first material being utilized around the entire length of the magnetic core, thereby causing the first part of the core to have high permeance. A second part of the magnetic core is made to have an effective permeance much lower than the first part. This second part may comprise a second kind of magnetic material having relatively low permeability, with this second material being utilized around the entire length of the magnetic core. Alternatively, this second part may be made mostly of material with high permeability (it may be the same material as the first part of the core), with a small section comprising an air gap or any combination of alternate materials with relatively low permeability. The low permeability of the small section causes the entire second part of the magnetic core to effectively operate with lower permeance than the first part of the core. In the absence of a d-c current component, current transformer operation is dominated by the properties of the first part of the magnetic core (which provides high permeance for relatively high accuracy). In the presence of a d-c current component, current transformer operation is dominated by the properties of the second part of the magnetic core (which provides non-saturated operation with reduced permeance and reduced accuracy).

The invention may be used in a basic current transformer configuration with a non-active load (similar to FIG. 15), with the optimized magnetic core providing improved accuracy in the presence of a d-c component in the primary current.

An alternate embodiment may include an electronic assist means along with a core having low permeance. This alternating-current transformer system for measuring a primary current may include:

(a) a current transformer having a saturable magnetic core optimized to have low incremental permeance so that a d-c component does not cause saturation of the magnetic core, thereby effecting a reduction of error resulting from a d-c component in the primary current;

(b) a controllable voltage device providing an output voltage in series with the secondary winding of the current transformer; and (c) a control means for controlling the voltage device; the control means and voltage device functioning together to provide an electronic assist to the current transformer, to effect additional reduction of error.

The invention is also a method for continuously providing a secondary alternating electric current that is approximately proportional to an alternating current component of a primary electric current, with the primary electric current subject to also having a d-c current component. The method includes the following steps:

(a) Construct a current transformer magnetic core having nonlinear permeance such that said magnetic core operates with high incremental permeance when the d-c current component is not present, thereby providing for current transformer operation with high accuracy when the d-c current component is not present; and the magnetic core operates in a non-saturated manner with reduced incremental permeance when the d-c current component is present, thereby providing current transformer operation with reduced accuracy when the d-c current component is present.

(b) Provide a secondary winding wrapped around the magnetic core.

(c) Terminate the secondary winding so that secondary current can flow freely.

(d) Cause the primary current to flow in a conductor configured as a primary winding of the current transformer, thereby causing the secondary alternating electric current to flow in the secondary winding.

Additional steps may be added to implement an electronic assist circuit to improve accuracy.

BRIEF DESCRIPTION OF THE DRAWINGS

FIG. 8 shows a prior-art solid magnetic core. This type of core is usually made of magnetic material with high permeability, resulting in a hysteresis curve similar to FIG. 4.

FIG. 9 shows a prior-art magnetic core similar to FIG. 8, but with a gap comprising alternate material having relatively low permeability. The gap causes the core to have relatively low permeance, with a hysteresis curve similar to FIG. 6.

FIG. 10 shows a magnetic core similar to FIG. 8, but a small section has been removed and replaced with an alternate magnetic material. Depending on properties of the alternate magnetic material used, and the resulting air gap, the resulting core has nonlinear permeance similar to the hysteresis curve of FIG. 7C.

FIG. 11 shows a magnetic core similar to FIG. 8, but with a hole that has been plugged with an alternate magnetic material. Depending on properties of the alternate magnetic material used, and the resulting air gap, the resulting core has nonlinear permeance similar to the hysteresis curve of FIG. 7C.

FIG. 12 shows a magnetic core made with two distinct parts, each having different permeance characteristics. One part has high permeance, and the second part has low permeance. Again, the resulting core has nonlinear permeance similar to the hysteresis curve of FIG. 7C.

DETAILED DESCRIPTION OF THE DRAWINGS

Figure 1:
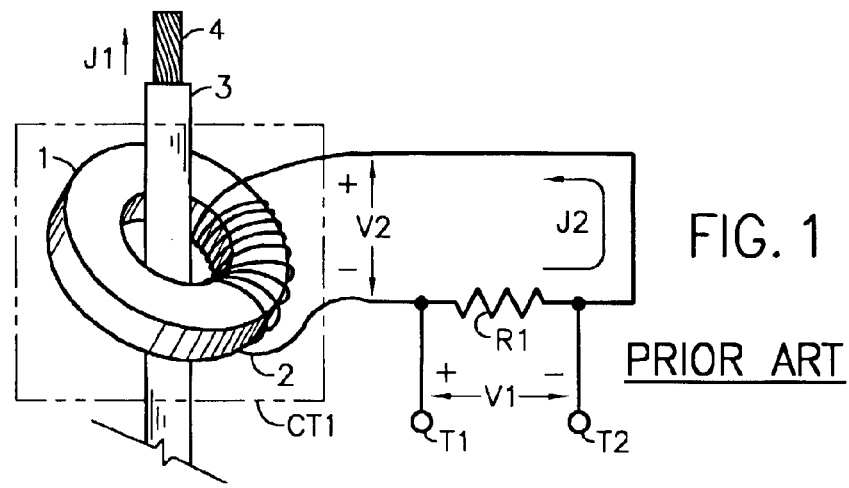
FIG. 1 illustrates a simple prior-art current transformer circuit that utilizes a current-sensing resistor to produce a voltage that is approximately proportional to primary current.

FIG. 1 illustrates a simple prior-art current measurement circuit. A current transformer CT1 comprises a saturable magnetic core 1 and a secondary winding 2 magnetically coupled to the magnetic core. An electric power system conductor 4 with an insulating covering 3 is configured as a primary winding with only one turn, with a primary electric current J1 flowing. Though shown with one end disconnected, power system conductor 4 is normally connected as part of an electric power system. Though a toroid having a rectangular cross section is shown for magnetic core 1, current transformer cores may be made with many different shapes. The number of winding turns shown for secondary winding 2 is for illustration only, and may vary widely depending on the particular application. Current transformers are also available with wound primary windings or with bar-type primary configurations.

A secondary electric current J2 is caused to flow by the transformer action of current transformer CT1 (in accordance with well-known current transformer principles). If current transformer CT1 were to have ideal properties, then secondary current J2 would be exactly (and instantaneously, with no phase-angle error) proportional to primary current J1, with magnitude reduced exactly by the turns ratio of the current transformer. However, since current transformers generally do not have ideal properties, current transformer CT1 is subject to a substantial error of ratio, phase-angle, or wave-shape in its output as a function of its burden, properties of the magnetic core, and a d-c component of the primary current. Therefore secondary current J2 is, at best, only approximately proportional to primary current J1.

In FIG. 1, a current-sensing resistor R1 with small resistance is connected in series with secondary winding 2 so that current J2 flows through resistor R1. A voltage signal V1 is the voltage across resistor R1, and is proportional to current J2. Since secondary current J2 is approximately proportional to primary current J1, voltage signal V1 is approximately proportional to primary current J1. Voltage signal V1 is often used as an input to a current monitoring system, energy meter, protective relay, or similar device. Terminals T1 and T2 are shown to facilitate connection to a larger system.

Voltage V2 is the secondary winding voltage that is measurable at the terminals of secondary winding 2. Not taking into account stray impedances, in FIG. 1 voltage V2 is equal to voltage V1 in magnitude, and is opposite in polarity. Voltage V2 is generated by the current transformer as a result of changing magnetic flux associated with exciting current.

Figure 2:
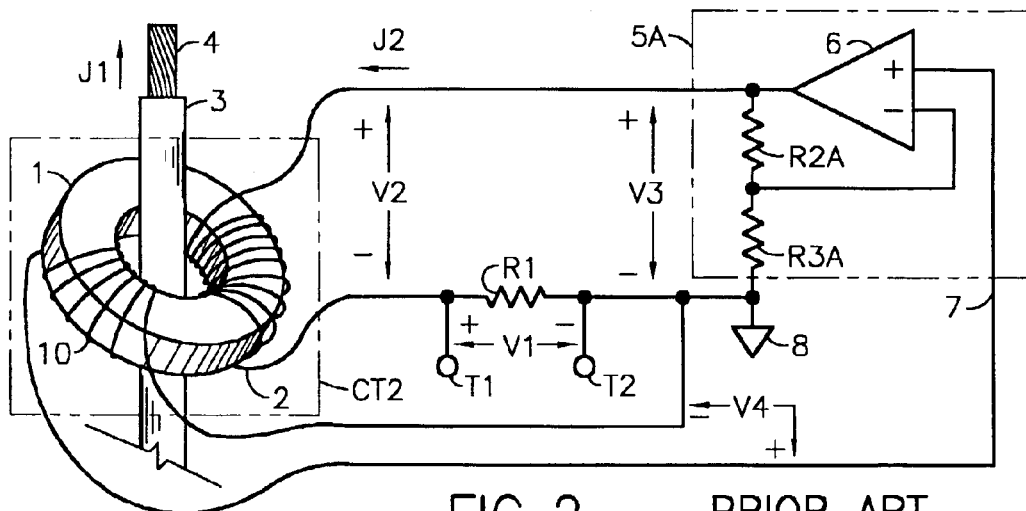
FIG. 2 illustrates a prior-art "zero-flux" current transformer circuit that utilizes a voltage device in the secondary circuit to improve accuracy for a-c current measurement applications. A sense winding 10 develops a voltage V4 that is proportional to the rate of change of magnetic flux in the magnetic core. This voltage is amplified and added in series with the secondary circuit so as to sharply reduce magnetic flux changes.

FIG. 2 illustrates a prior-art "zero-flux" current transformer circuit that utilizes a controllable voltage device 5A in the secondary circuit as part of an electronic assist means to improve accuracy for a-c current measurement applications. Though an operational amplifier circuit is shown, voltage device 5A may be any kind of device that can produce a controllable output voltage. Controllable voltage device 5A functions as both a voltage device providing an output voltage V3 in series with secondary current, and as a control means for the voltage device. The control means may be thought of as resistors R2A and R3A, which control the gain of operational amplifier 6.

A current transformer CT2 is similar to current transformer CT1 in FIG. 1, except that now a sense winding 10 is added to magnetic core 1. Sense winding 10 is a third winding (in addition to the primary and secondary windings) magnetically coupled to magnetic core 1. Sense winding 10 is terminated in a high-impedance manner and therefore has almost no current flowing in it. With almost no current flowing, a voltage signal V4 that is measurable across sense winding 10 is proportional to the rate of change of magnetic flux in the magnetic core (in accordance with Faraday's Law). Voltage signal V4 is connected to an operational amplifier 6 by a conductor 7. The resistance of resistor R2A is selected to be much greater than resistor R3A so that the voltage gain of the amplifier is relatively large. Voltage V3 is the output voltage of the voltage device, and is simply voltage signal V4 amplified. Voltage V3 is connected in series with the secondary winding, and provides most of the driving voltage required to drive current J2 through the secondary loop impedances. These loop impedances include resistor R1, stray winding resistance, stray winding reactance, and stray impedances of connecting wires. This sharply reduces changes of magnetic flux in magnetic core 1, thereby sharply reducing the exciting current error, thereby making secondary current J2 more accurately proportional to primary current J1, thereby improving the accuracy of the current transformer. Ground symbol 8 indicates a connection to a zero voltage reference. Power supply connections for operational amplifier 6 are not shown. Operational amplifier 6 is preferably a power operational amplifier, with current and voltage ratings coordinated with the current transformer secondary current and burden.

Figure 3:
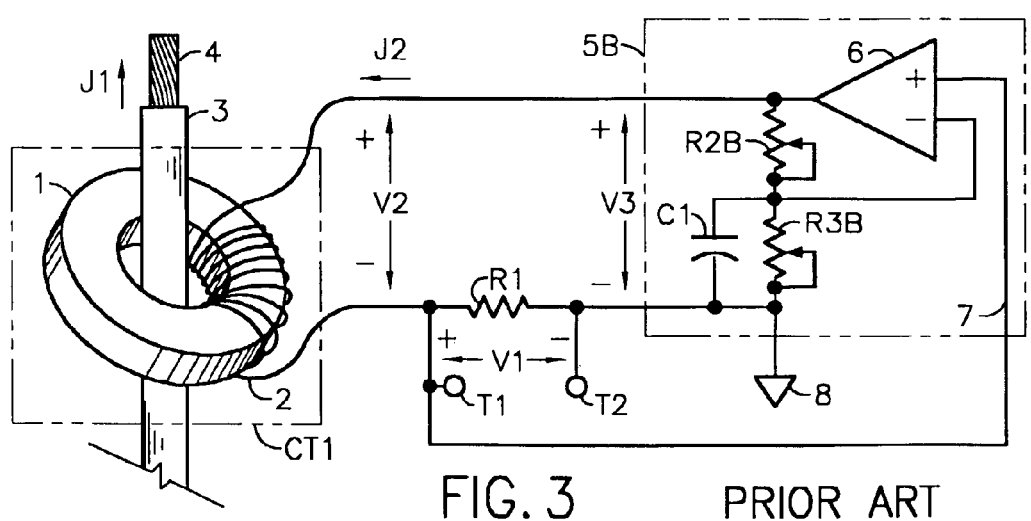
FIG. 3 illustrates another prior-art circuit that utilizes a voltage device in the secondary circuit to improve accuracy for a-c current measurement applications. This circuit utilizes a signal that is proportional to secondary current to control the voltage device with a proportional plus derivative type of control. When properly adjusted, the voltage device provides most of the voltage necessary to drive secondary current through secondary loop impedances, thereby sharply reducing flux changes in the current transformer core.

FIG. 3 shows another prior-art circuit that operates in a near-zero-flux manner with an electronic assist means. This "burden-reducing" circuit uses the secondary current as an input to generate the compensation voltage required to drive secondary current. This circuit has the advantage of utilizing ordinary current transformers without the need for a sense winding or Hall-effect sensor.

Current transformer CT1 and current-sensing resistor R1 are the same as shown in FIG. 1. A controllable voltage device 5B produces an output voltage V3 similar to voltage device 5A of FIG. 2. Controllable voltage device 5B functions as both a voltage device providing output voltage V3 in series with secondary current, and as a control means for the voltage device. The control means may be thought of as resistors R2B and R3B and capacitor C1, which control the gain of operational amplifier 6. Resistor R1 functions as a sensing means for sensing secondary electric current, and voltage V1 is an information signal which is received by the control means for controlling output voltage V3.

In FIG. 3, voltage V3 is controlled based on voltage signal V1. Resistor R2B, Resistor R3B, and Capacitor C1 are configured to cause voltage V3 to have a component that is proportional to secondary current (which is proportional to voltage signal V1) and to have a component that is proportional to the rate-of-change of secondary current. The component that is proportional to secondary current provides the driving voltage required to drive secondary current through secondary resistances (such as resistor R1, winding resistance, and stray resistances of other conductors). The component that is proportional to the rate-of-change of secondary current provides the driving voltage required to drive secondary current through secondary reactive impedances (such as stray inductances in the secondary winding and other conductors). Resistors R2B and R3B are shown as adjustable to facilitate calibration for optimum operation, but they may alternately be fixed resistors. Adjusting resistor R3B calibrates for the ratio of secondary loop resistance to inductance, while adjusting resistor R2B adjusts the gain of the amplifier. For secondary circuits in which stray inductances are small, capacitor C1 may be omitted, in which case the gain of the amplifier should simply be set to a value slightly less than the total secondary loop resistance divided by the resistance of R1.

Figure 4:
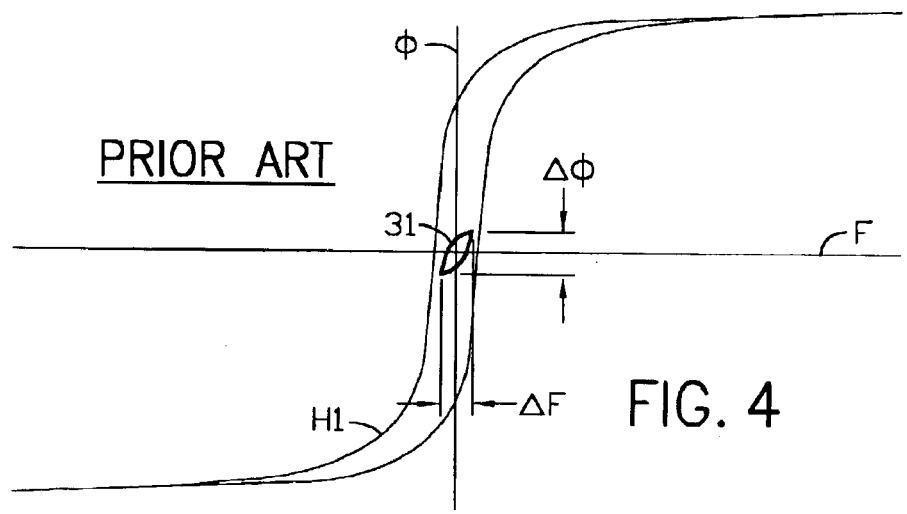
FIG. 4 shows a hysteresis curve H1 for a prior-art current transformer core. The minor loop 31 shows normal current transformer operation with no d-c component present.

FIG. 4 shows a hysteresis curve H1 for a prior-art current transformer core. The hysteresis curve is for the magnetic core (rather than the magnetic material in the core), with magnetomotive force F varying along the horizontal axis, and magnetic flux $\Phi$ varying along the vertical axis. Movement away from the vertical axis (increasing magnetomotive force, positive or negative) is proportional to secondary current error, since magnetomotive force is proportional to the instantaneous sum of the primary electric current multiplied by the number of turns of the primary winding and the secondary electric current multiplied by the number of turns of the secondary winding.

The minor loop 31 shows normal current transformer operation with no d-c component present. Minor loop 31 is associated with a flux change $\Delta\Phi$ and magnetomotive force change $\Delta F$. Incremental permeance for this operating mode is relatively high, since $\Delta\Phi/\Delta F$ is relatively large (compared with FIGS. 5 & 6).

Figure 5:
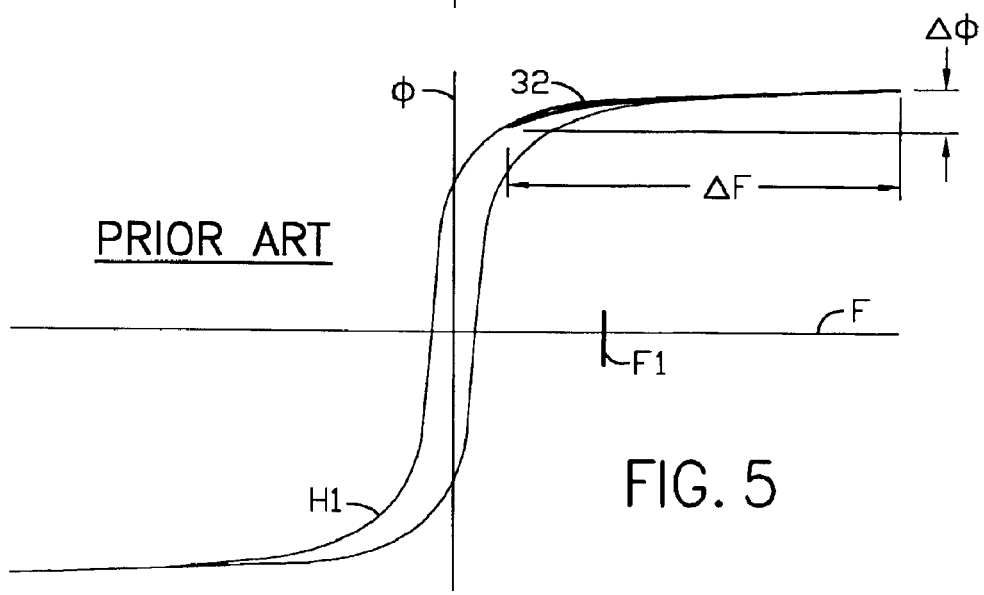
FIG. 5 shows the same hysteresis curve H1 as FIG. 4, but with a minor loop 32 showing current transformer operation with a d-c current component present in the primary current.

FIG. 5 shows the same hysteresis curve H1 as FIG. 4, but with a minor loop 32 showing current transformer operation with a d-c current component present in the primary current. The d-c component causes the magnetomotive force experienced by the magnetic core to have an average value corresponding to F1. Magnetomotive force F1 is the magnitude of the d-c current component of primary current multiplied by the number of primary winding turns. This causes the magnetic core to saturate, resulting in magnetomotive force change $\Delta F$ being very large. This corresponds to very large secondary current error, and very poor current transformer accuracy. This also correlates to an incremental permeance ($\Delta\Phi/\Delta F$) that is unacceptably low.

Figure 6:
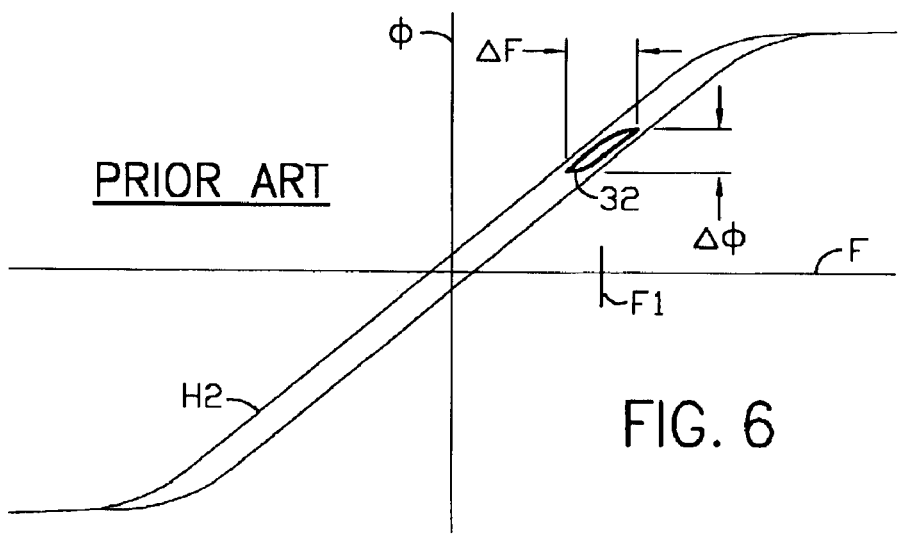
FIG. 6 shows a hysteresis curve H2 for a prior-art magnetic core that has relatively low permeance. This core shows improved operation in the presence of a d-c current. However, accuracy when a d-c component is not present is adversely affected (when compared to the magnetic core of FIG. 1).

FIG. 6 shows a hysteresis curve H2 for a prior-art magnetic core that has relatively low permeance. Minor loop 33 shows improved current transformer operation in the presence of a d-c current component. However, accuracy when a d-c component is not present is adversely affected (when compared to FIG. 4). Incremental permeance (ΔΦ/ΔF) is relatively uniform between saturation limits, so current transformer accuracy is relatively unaffected by the presence of a d-c component in the primary current. The negative aspect of this configuration is that current transformer error (which is proportional to ΔF) in the absence of a d-c component is considerably larger than for the curve of FIG. 4.

Figure 7A:
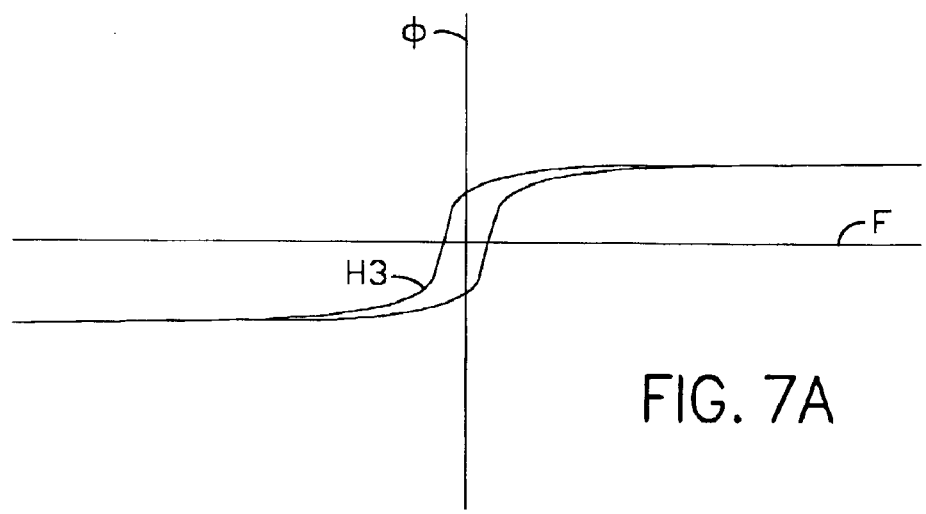
FIGS. 7A, 7B and 7C show how an optimized magnetic core with nonlinear permeance can be made by constructing a core that combines the characteristics of two common hysteresis curves.
Figure 7B:
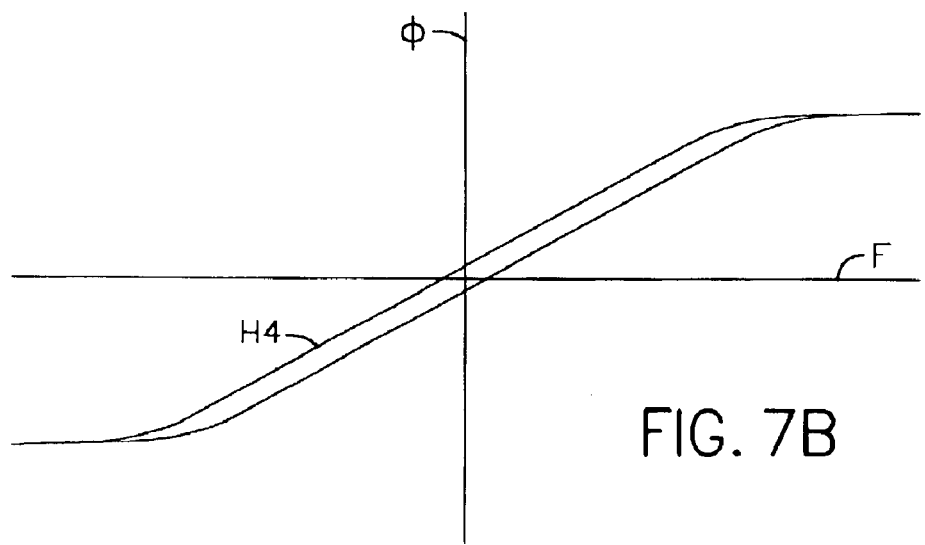
Figure 7C:
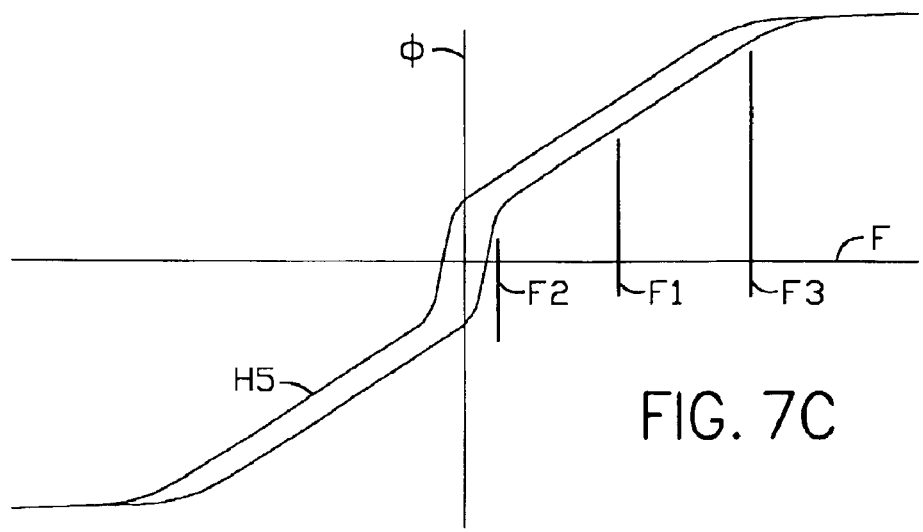

FIGS. 7A, 7B and 7C show how an optimized magnetic core with nonlinear permeance can be made by constructing a core that combines the characteristics of two common hysteresis curves. The nonlinear permeance shown in FIG. 7C provides high accuracy in the absence of a d-c current component, while providing reduced accuracy when a d-c current component is present in the primary current.

In FIG. 7A, a hysteresis curve H3 represents a first part of a magnetic core which has high permeance.

In FIG. 7B, a hysteresis curve H4 represents a second part of the magnetic core which has lower permeance than the first part.

In FIG. 7C, a hysteresis curve H5 represents the total core, and is approximately the summation of the hysteresis curves in FIGS. 7A and 7B. A first magnitude F1 of magnetomotive force equals a predetermined maximum magnitude of the d-c current component of primary current multiplied by the number of turns of the primary winding. A predetermined second magnitude F2 of magnetomotive force is smaller than first magnitude F1. Below second magnitude F2, the permeance of the magnetic core is relatively high. This provides for high current transformer accuracy in the absence of a d-c current component. The core does not saturate below a predetermined third magnitude F3 of magnetomotive force. Third magnitude F3 is greater than first magnitude F1. Between magnitudes F2 and F3 the magnetic core operates with reduced incremental permeance, providing reduced (but acceptable) current transformer accuracy in the presence of a d-c component.

While FIG. 7C shows a fairly distinct transition from high incremental permeance to lower incremental permeance, a more gradual transition may be preferable for many applications.

Though some parts of the magnetic materials in the magnetic core may be saturated below third magnitude F3, the overall magnetic core hysteresis characteristic does not thoroughly saturate below third magnitude F3.

FIG. 8 shows a prior-art solid magnetic core 1. Current transformer cores are usually made of magnetic material with high permeability, resulting in a hysteresis curve similar to FIG. 4. The core may be made of any saturable magnetic material. Often, current transformer cores are made of tape-wound silicon steel or tape-wound nickel-iron compounds. Ferrite materials are also commonly used. The invention is not limited to any particular kind of magnetic material.

FIG. 9 shows a prior-art magnetic core 1A similar to FIG. 8, but with a gap 11 comprising alternate material having relatively low permeability. The gap causes the magnetic core to have relatively low permeance, with a hysteresis curve similar to FIG. 6. The low permeance makes this core more suitable for use with a d-c current component. However, the low permeance also adversely affects current transformer accuracy in the absence of a d-c component.

FIG. 10 shows one way that a magnetic core may be made in accordance with the present invention. A magnetic core 1B is similar to core 1 of FIG. 8, but a notch has been made in the core and filled with an alternate material. Depending on properties of the alternate material used, and the resulting air gap, the resulting core has nonlinear permeance similar to the hysteresis curve of FIG. 7C. Theoretically, the notch may just be a very thin air gap, on the order of about 0.1 millimeter thick. However, since it is very difficult to cut a deep notch this thin, it is preferable to cut a thicker notch and fill it with alternate material. The alternate material may be magnetic material that is similar to the rest of the core, with a small air gap around the filled area causing the magnetic core to have the desired nonlinear permeance. The alternate material may also be a different kind of magnetic material with different magnetic properties. Any combination of materials that result in a preferred nonlinear permeance characteristic may be used. The intent is to make a small section of the core comprise alternate material effectively having lower permeability than the rest of the core. From another point of view, the intent is to effectively provide a small gap across only part of the core.

Magnetic core 1B effectively operates as two parts having different permeances: the first part can be thought of as the fraction of the magnetic core not notched, with the second part being the fraction that is notched. For example, if the notch extends across 60% of the cross section of the core, then 40% of the core would operate with a high first permeance (the first part, similar to the hysteresis curve of FIG. 7A) and 60% of the core would operate with lower second permeance (the second part, similar to the hysteresis curve of FIG. 7B). The two parts combined operate with nonlinear permeance (similar to the hysteresis curve of FIG. 7C).

FIG. 11 shows another way that a magnetic core may be made in accordance with the present invention. The concept is the same as for FIG. 10, though the construction details are somewhat different. A magnetic core 1C is similar to core 1 of FIG. 8, but a hole has been made in the core and plugged with an alternate magnetic material. Depending on properties of the alternate magnetic material used, and the resulting air gap, the resulting core has nonlinear permeance similar to the hysteresis curve of FIG. 7C. The plug may be magnetic material that is similar to the rest of the core, with a small air gap around the plug causing the magnetic core to have the desired nonlinear permeance. Similar to FIG. 10, a small section of the core is made to comprise alternate material effectively having lower permeability than the rest of the core. This effectively provides a small gap across only part of the magnetic core.

The magnetic properties of many magnetic materials are affected by the stress or heat associated with drilling, cutting, or machining the core, and this may also be a factor contributing to the desired nonlinear permeance of the magnetic core.

FIG. 12 shows a magnetic core actually made with two distinct parts, each part having a different permeance characteristic. A first part 1D has high permeance (similar to the hysteresis curve of FIG. 7A), and a second part 1E has low permeance (similar to the hysteresis curve of FIG. 7B). Again, the resulting core has nonlinear permeance (similar to the hysteresis curve of FIG. 7C). The second part may be made to have lower permeance by utilizing a magnetic material having lower permeability than the material used in the first part. Alternately, the second part may be manufactured with a small gap to cause the preferred lower permeance.

In FIG. 12, each part is configured to provide a closed magnetic path, so that the two parts operate in parallel, from a magnetic circuit point of view. In the case that two different kinds of magnetic materials are used to make the two parts, a first magnetic material has high permeability and a second magnetic material has permeability that is lower than the first magnetic material. The first magnetic material is configured to provide a closed magnetic path, and the second magnetic material is also configured to provide a closed magnetic path. The two parts operating together cause the magnetic core to have nonlinear permeance.

Figure 13:
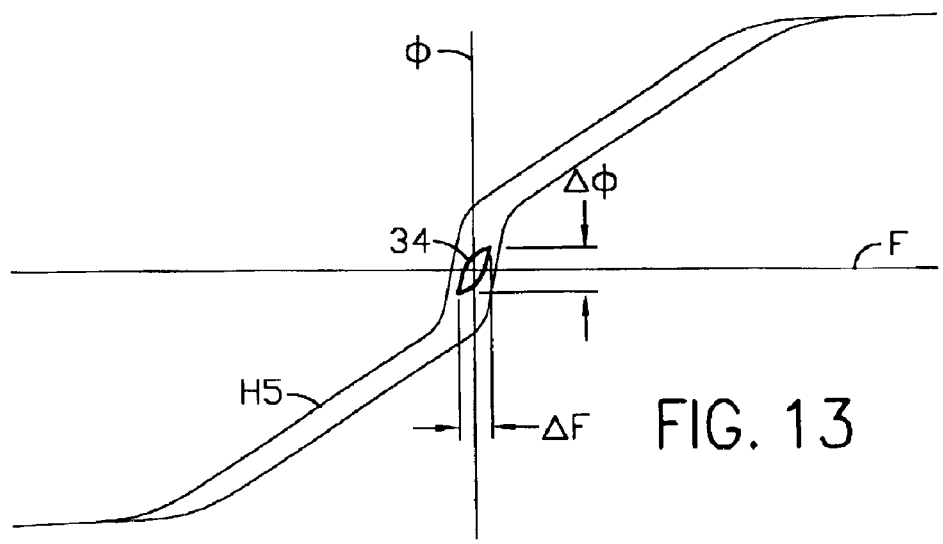
FIGS. 13 and 14 show how a magnetic core with nonlinear permeance operates with high incremental permeance and high accuracy when a d-c component is not present, and operates in a non-saturated manner with reduced incremental permeance and reduced accuracy when a d-c current component is present.
Figure 14:
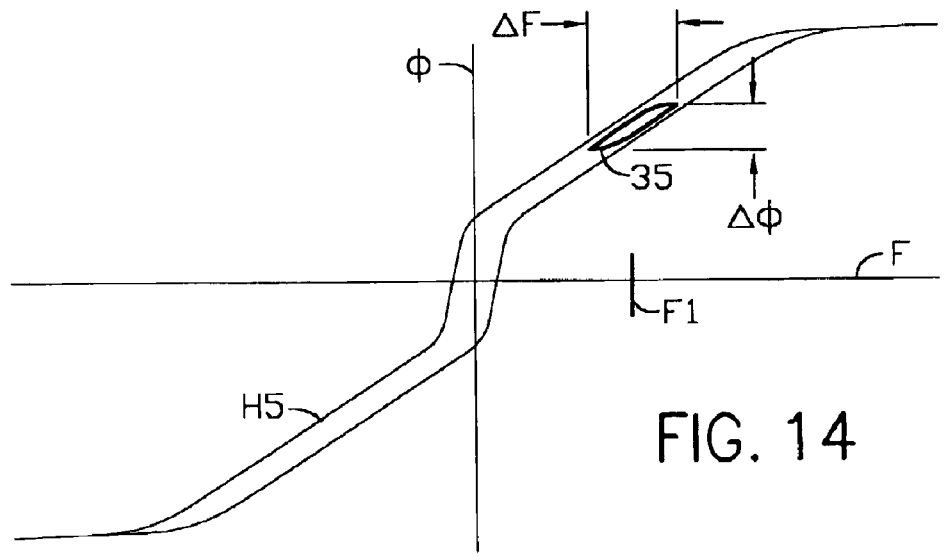

FIGS. 13 and 14 show how a magnetic core with nonlinear permeance operates with high incremental permeance and high accuracy when a d-c component is not present, and operates in a non-saturated manner with reduced incremental permeance and reduced accuracy when a d-c current component is present.

In FIG. 13, hysteresis curve H5 has nonlinear permeance similar to FIG. 7C. A minor loop 34 shows how the core operates in the high incremental permeance region in the absence of a d-c component in the primary current. $\Delta\Phi/\Delta F$ is relatively large, corresponding to high current transformer accuracy.

In FIG. 14, a minor loop 35 shows how the core operates in the low incremental permeance region in the presence of a d-c component in the primary current. The d-c current component corresponds to magnetomotive force F1. $\Delta\Phi/\Delta F$ is now lower than in FIG. 13, corresponding to reduced (but acceptable) current transformer accuracy.

Figure 15:
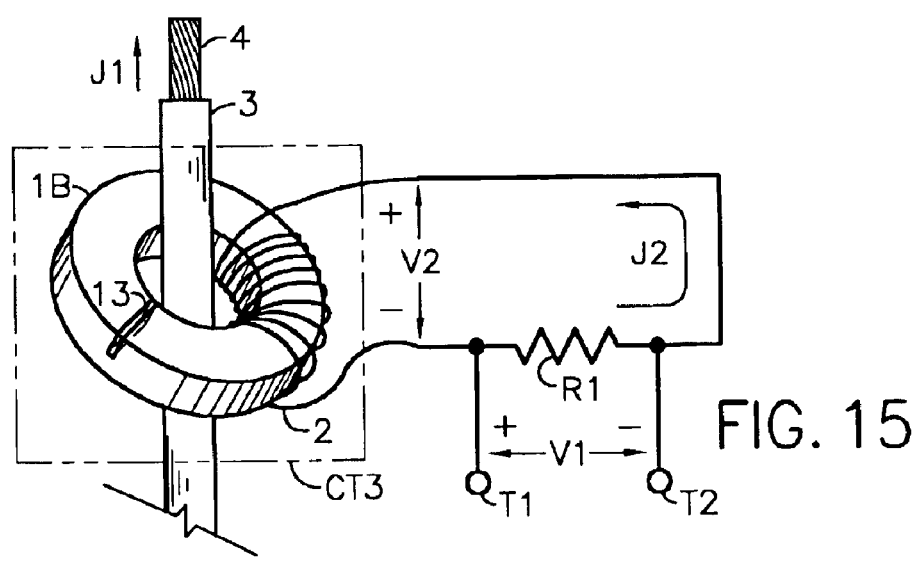
FIGS. 15, 16 and 17 show current transformer circuits similar to FIGS. 1, 2, and 3, but with improved magnetic cores for improved operation when the primary current has a d-c current component.

FIG. 15 is similar to FIG. 1, except that now a current transformer CT3 utilizes magnetic core 1B (per FIG. 10) having nonlinear permeance. This enables the current transformer to operate with high accuracy in the absence of a d-c current component, and operate satisfactorily with reduced accuracy in the presence of a d-c current component.

Figure 16:
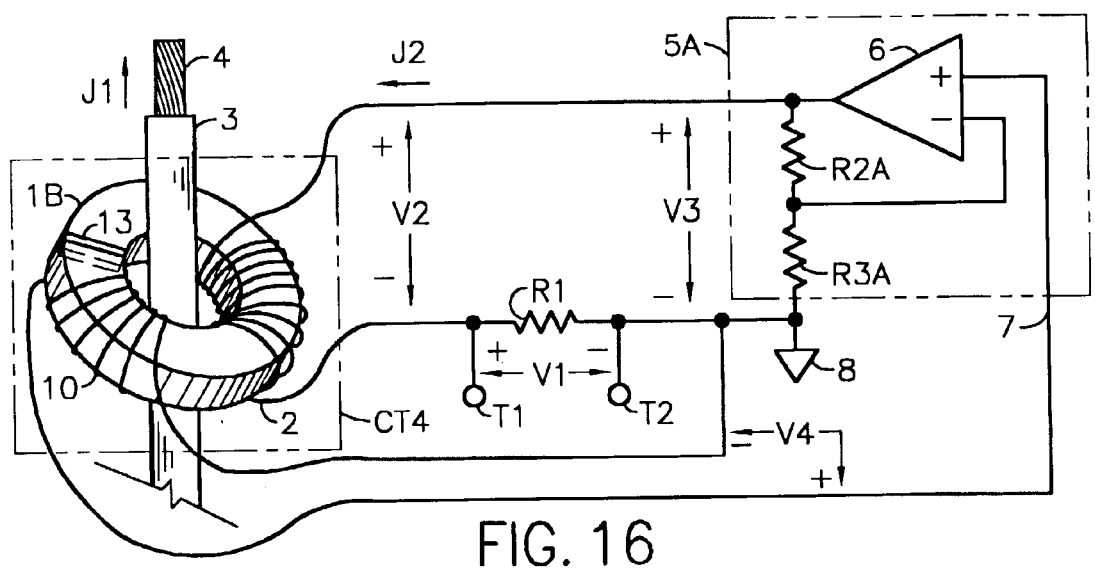

FIG. 16 is similar to FIG. 2, except that now a current transformer CT4 utilizes magnetic core 1B (per FIG. 10) having nonlinear permeance. This enables the current transformer to operate with high accuracy in the absence of a d-c current component, and operate satisfactorily with reduced accuracy in the presence of a d-c current component.

Figure 17:
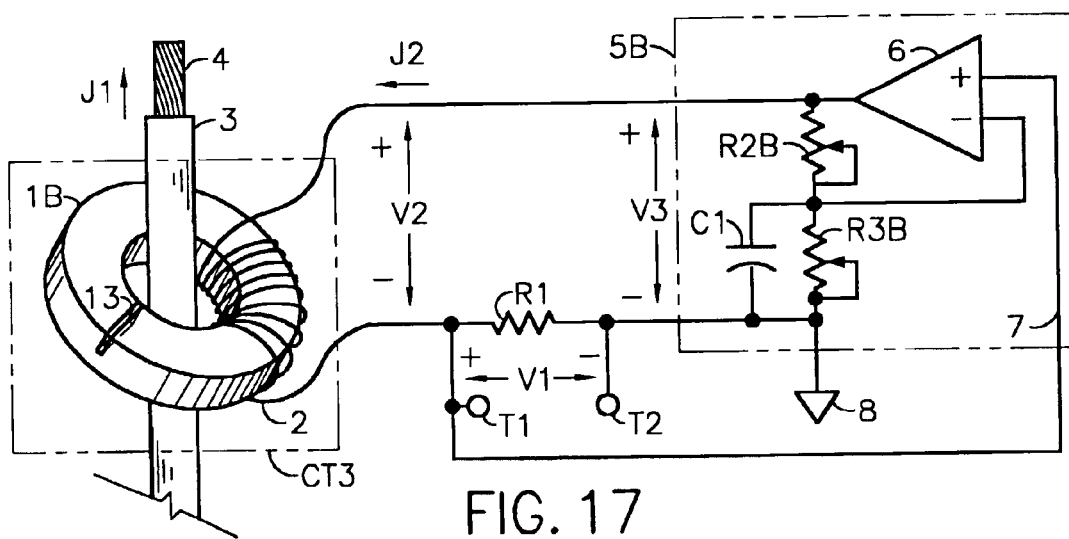

FIG. 17 is similar to FIG. 3, except that now current transformer CT3 is used with magnetic core 1B (per FIG. 10) having nonlinear permeance. This enables the current transformer to operate with high accuracy in the absence of a d-c current component, and operate satisfactorily with reduced accuracy in the presence of a d-c current component.

Since secondary winding 2 is usually made with copper, and copper has a relatively high temperature coefficient, the resistance of secondary winding 2 may change significantly with temperature changes. This can have an adverse effect on the accuracy of the burden-reducing compensation. To automatically correct for this, the gain of voltage device 5B can be made to vary with temperature. This can be done by specifying resistor R2B to have a temperature coefficient similar to copper (resistor R2B does not need to be adjustable). Then the constant of proportionality between secondary current J2 (or voltage V1) and output voltage V3 is automatically adjusted to compensate for changes in burden due to temperature changes. For best temperature compensation, resistor R2B may be placed adjacent to, or within, secondary winding 2, so that the temperature of resistor R2B is very nearly the same temperature as winding 2. Then as secondary winding resistance increases due to increasing temperature, the gain of voltage device 5B increases an appropriate amount to compensate for the additional burden. This type of automatic gain control based on temperature may also be utilized in the circuits shown in FIGS. 18 and 19.

While FIGS. 15, 16, and 17 all utilize magnetic core 1B (of FIG. 10), it should be understood that the same benefits are realized with any magnetic core having the preferred nonlinear permeance (such as the magnetic cores shown in FIGS. 11 and 12).

Figure 18:
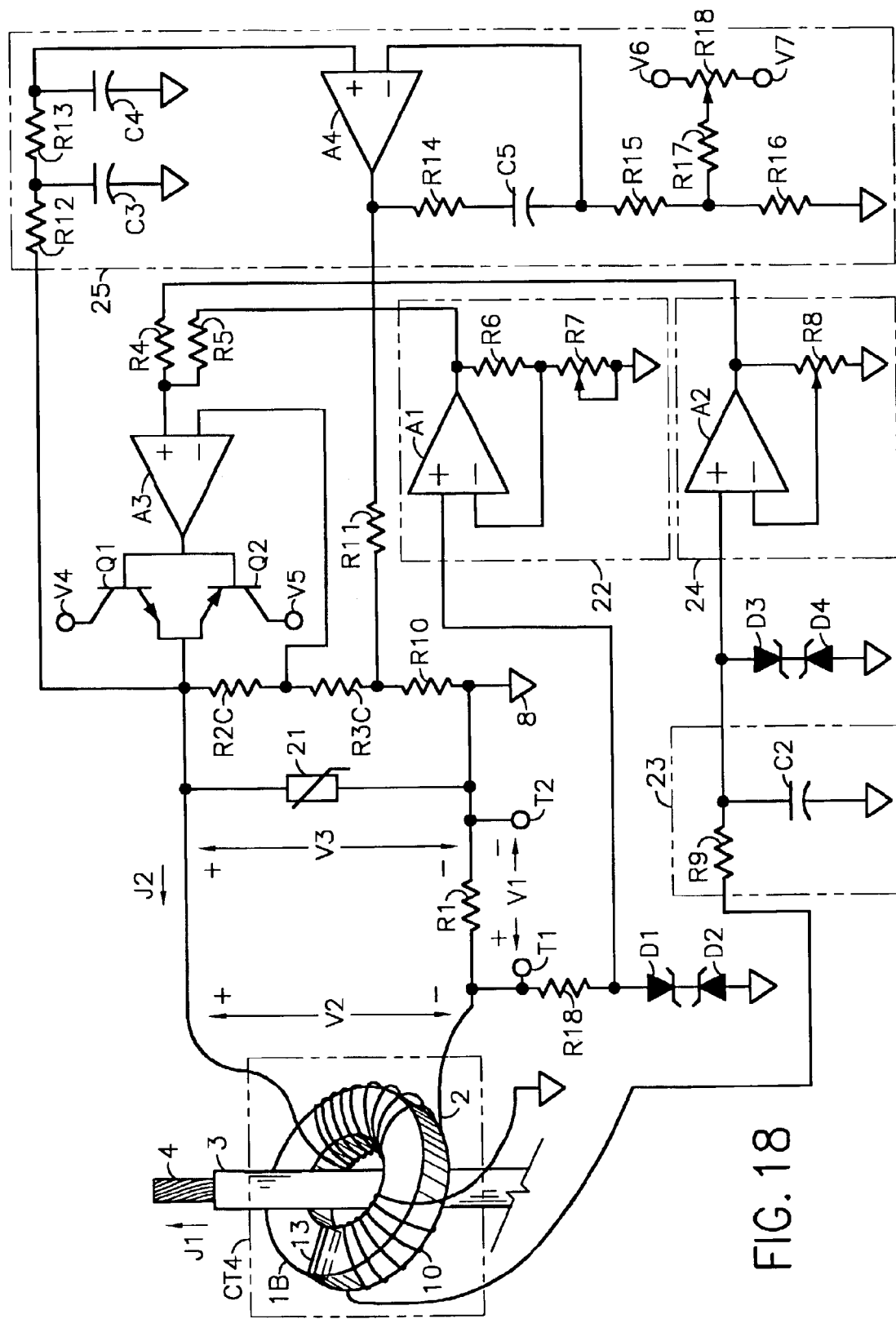
FIG. 18 shows an alternate embodiment that combines two types of electronic assist means along with other optional improvements. Many of the improvements shown may be incorporated into previous circuits.

FIG. 18 shows an alternate embodiment that combines two types of electronic assist means along with other optional improvements. Man of the improvements shown may be incorporated into circuits previously discussed.

FIG. 18 combines the zero-flux electronic assist means of FIGS. 2 and 16 with the burden-reducing electronic assist means of FIGS. 3 and 17. An amplifier 22 uses operational amplifier A1 to provide proportional compensation control, so that output voltage V3 has a component that is proportional to secondary current, similar to FIGS. 3 and 17 (compensation for stray reactances is not included). An amplifier 24 uses operational amplifier A2 to provide zero-flux feedback control based on the induced voltage signal across sense winding 10, similar to FIGS. 2 and 16. Operational amplifier A3 is configured to add the outputs of operational amplifiers A1 and A2 so that output voltage V3 is the sum of both signals. Transistors Q1 and Q2 provide current gain, so that a single quad low-power operational amplifier integrated circuit can be utilized for all four operational amplifiers. A d-c offset control circuit 25 uses feedback control sys tem principles to minimize d-c offset associated with output voltage V3. A lowpass filter 23 provides a dominant pole to improve stability of the zero-flux feedback circuit. A surge suppressor 21 protects the output circuit from high voltages which may result during fault conditions on the primary circuit. Zener diodes D1, D2, D3, an d D4 are configured to provide surge protection to amplifier inputs.

More specific circuit details follow: Resistor R18 limits surge current through zener diodes D1 and D2. Resistors R2C and R3C set the gain of the output circuit. Resistors R4 and R5 have resistances that are approximately equal, so that the output signals of operational amplifiers A1 and A2 are added with equal weighting. Resistors R10 and R11 form a voltage divider for the output of d-c offset control circuit 25. Resistors R12 and R13 and capacitors C3 and C4 form a two-pole lowpass filter, the output of which is approximately the d-c offset of output voltage V3. Operational amplifier A4, resistors R14 and R15, and capacitor C5 are configured to provide proportional plus integral control for d-c offset voltage (with the output signal being divided across resistors R10 and R11). Resistors R16 and R17, and potentiometer R18 are configured to provide adjustable d-c offset compensation for operational amplifier A4. Terminals V4 and V6 are connected to the positive power supply voltages (not shown), and terminals V5 and V7 are connected to the negative power supply voltages (not shown). The power supply connections for the operational amplifiers are not shown. Potentiometer R8 sets the gain of amplifier 24, and adjustable resistor R7 and resistor R6 set the gain of amplifier 22.

A preferred embodiment of FIG. 18 utilizes components with the following parameters:

| | |
|---|---|
| Resistor R1: | 5.0 ohms, ¼ watt |
| Resistor R2C: | 51 kohms, ¼ watt |

-continued

| | |
|---|---|
| Resistor R3C: | 51 kohms, ¼ watt |
| Resistor R4: | 10 kohms, ¼ watt |
| Resistor R5: | 10 kohms, ¼ watt |
| Resistor R6: | 20 kohms, ¼ watt |
| Resistor R7: | adjustable to 10 kohms |
| Potentiometer R8: | 50 kohms, ¼ watt |
| Resistor R9: | 10 kohms, ¼ watt |
| Resistor R10: | 500 ohms, ¼ watt |
| Resistor R11: | 51 kohms, ¼ watt |
| Resistor R12: | 1.0 Mohms, ¼ watt |
| Resistor R13: | 1.0 Mohms, ¼ watt |
| Resistor R14: | 5.1 Mohms, ¼ watt |
| Resistor R15: | 1.0 Mohms, ¼ watt |
| Resistor R16: | 100 ohms, ¼ watt |
| Resistor R17: | 51 kohms, ¼ watt |
| Potentiometer R18: | 50 kohms |
| Capacitor C2: | 0.01 microfarad |
| Capacitor C3: | 0.1 microfarad |
| Capacitor C4: | 0.1 microfarad |
| Operational Amplifiers A1, A2, A3, A4: | Texas Instruments TL074 |
| Transistor Q1: | NPN, 2-Watt, Minimum current gain: 30 |
| Transistor Q2: | PNP, 2-Watt, Minimum current gain: 30 |
| Surge Suppressor 21: | 10.2-volt standoff; 5W continuous, 1500W pulse |
| Zener Diodes D1, D2, D3, D4: | 4.3 Volt, 1 Watt |
| Magnetic core 1B: | Grain-oriented silicon steel, 11-mil tape-wound, epoxy-coated; inside diameter 1.25", outside diameter 1.625", width 0.375", with notch 13 approximately 60% of cross section and filled with similar magnetic material resulting in an effective gap of about 0.1 millimeter. |
| Winding 2: | 2000 turns of #32 AWG copper magnet wire |
| Winding 10: | 1000 turns of #32 AWG copper magnet wire |
| Power Supply: | +/− 12 volts d-c |

Figure 19:
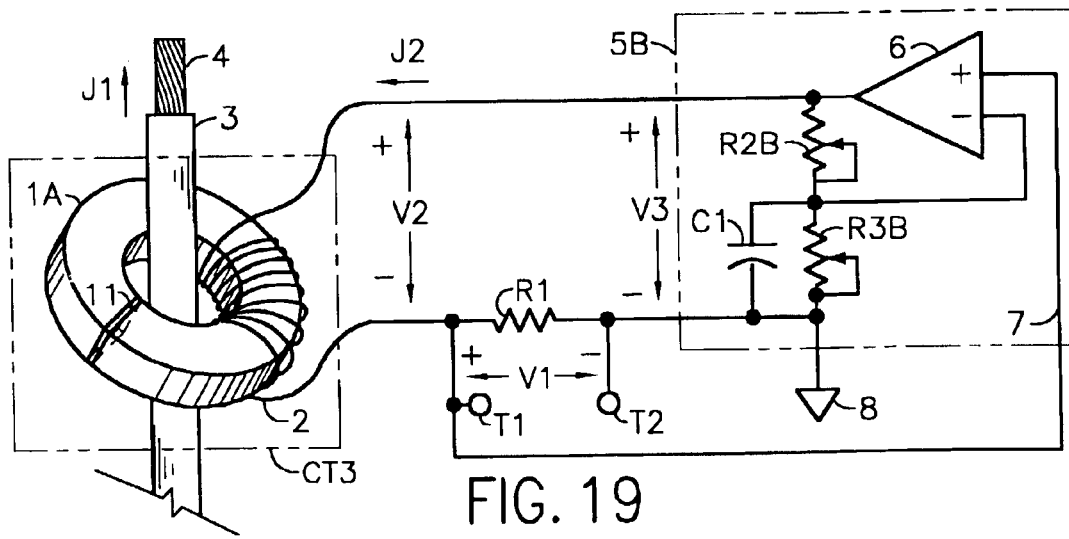
FIG. 19 shows an alternate embodiment that combines a magnetic core having low permeance with an electronic assist means (similar to FIG. 17). The electronic assist provides accuracy improvement, while the low permeance of the magnetic core prevents saturation when a d-c current component is present in the primary current.

FIG. 19 shows an alternate embodiment that combines a magnetic core 1A having low permeance (similar to FIG. 9) with an electronic assist means (similar to FIG. 17). The electronic assist provides accuracy improvement, while the low permeance of the magnetic core prevents saturation when a d-c current component is present in the primary current. The low permeance of the magnetic core may be caused by a gap (as in FIG. 9), or it may be a direct consequence of the magnetic material chosen for the core. For example, the core may be made of powdered magnetic material held together by a nonmagnetic medium, which effectively results in a distributed gap and relatively low permeance. Alternatively, a tape-wound core may be made with extra insulating material between laminations, which again effectively results in a distributed gap and relatively low permeance. Another option is to simply make the core from poorer-quality magnetic material, such as annealed iron.

While the embodiment of FIG. 19 does not provide as good of accuracy as the circuit of FIG. 17 (when a d-c current component is not present), the construction of magnetic core 1A may be more economical than a core with nonlinear permeance. Therefore, the configuration of FIG. 19 may be preferred to FIG. 17 in some applications. It should be noted that the electronic assist means shown in FIGS. 16 and 18 may also be utilized with a low-permeance magnetic core (such as magnetic core 1A) for cost-sensitive applications in which accuracy is not critical.

While several embodiments have been described and illustrated, there are many other embodiments possible that will be apparent to those skilled in the art. It is not the intent of this disclosure to limit the invention to the embodiments that have been illustrated. The components and configurations utilized in this disclosure are intended to be illustrative only, and are not intended to limit the scope of the appended claims.

While only certain preferred features of the invention have been shown by way of illustration, many modifications and changes will occur to those skilled in the art. It is, therefore, to be understood that the appended claims are intended to cover all such modifications and changes as fall within the true spirit of the invention.

I claim:

1. An a-c current transformer able to function with a primary electric current having a d-c current component; said current transformer comprising a saturable magnetic core and a secondary winding magnetically coupled to said magnetic core; said primary electric current flowing in a conductor configured as a primary winding of said current transformer; wherein the improvement is that said magnetic core is optimized to have nonlinear incremental permeance such that (a) said magnetic core operates with high incremental permeance when said d-c current component is not present, thereby providing for current transformer operation with high accuracy when said d-c current component is not present; and (b) said magnetic core is constructed so that a first part of said magnetic core operates with a high first permeance, and a second part of said magnetic core operates with a second permeance that is lower than said first permeance, thereby causing said magnetic core to have said nonlinear incremental Permeance;

said magnetic core does not saturate when said d-c current component is present; and (d) said magnetic core operates in a non-saturated manner with reduced incremental permeance when said d-c current component is present, thereby providing current transformer operation with reduced accuracy when said d-c current component is present.

2. The a-c current transformer of claim 1 wherein said magnetic core experiences a magnetomotive force, said magnetomotive force having an instantaneous magnitude approximately equal to the instantaneous sum of magnetomotive force contributions from every winding magnetically coupled to said magnetic core; a first magnitude of said magnetomotive force being equal to a predetermined maximum magnitude of said d-c current component multiplied by a number of turns of said primary winding;

wherein said improvement is further characterized by:

(a) said magnetic core has said high incremental permeance whenever said magnetomotive force is smaller than a predetermined second magnitude, thereby providing said high accuracy in the absence of said d-c current component; said second magnitude being less than said first magnitude;

(b) said magnetic core has said reduced incremental permeance whenever said magnetomotive force is greater than said second magnitude and smaller than a predetermined third magnitude, thereby providing current transformer operation with said reduced accuracy in the presence of said d-c current component; said third magnitude being greater than said first magnitude; and (c) said magnetic core does not thoroughly saturate whenever said magnetomotive force is smaller than said third magnitude.

3. The a-c current transformer of claim 1, wherein said first part and said second part comprise a first magnetic material having high permeability, and a small section of said second part comprises alternate material having lower permeability than said first magnetic material, thereby causing said second part to have lower permeance than said first part.

4. The a-c current transformer of claim 1, wherein said first part comprises a first magnetic material having high permeability, and said second part comprises a second magnetic material having lower permeability than said first magnetic material, thereby causing said second part to have lower permeance than said first part.

5. The a-c current transformer of claim 1 further comprising an electronic assist means for improving the accuracy of said current transformer; said electronic assist means comprising a voltage device connected in series with said secondary winding; a control means for controlling said voltage device, and a third winding magnetically coupled to said magnetic more; said third winding connected to said control means and terminated in a high-impedance manner so that a voltage signal across said third winding is approximately proportional to a rate of change of a magnetic flux in said magnetic core; said voltage device providing an output voltage which controls said rate of change of said magnetic flux; said control means receiving said voltage signal and controlling said voltage device so that changes of said magnetic flux are reduced, thereby improving said accuracy of said current transformer.

6. The a-c current transformer of claim 1 further comprising an electronic assist means for improving the accuracy of said current transformer; said electronic assist means comprising a voltage device connected in series with said secondary winding, a control means for controlling said voltage device, and a sensing means for sensing said secondary electric current and providing an information signal to said control means; said voltage device providing an output voltage which controls a rate of change of a magnetic flux in said magnetic core; said control means receiving said information signal and controlling said voltage device so that changes of said magnetic flux are reduced, thereby improving said accuracy of said current transformer.

7. The a-c current transformer of claim 6 wherein said control means further controls said voltage device so that said output voltage has a component that is proportional to said secondary electric current, with a constant of proportionality automatically adjusting to compensate for changes in burden due to temperature changes.

8. The a-c current transformer of claim 7 wherein said control means further includes a feedback control system to minimize a d-c offset associated with said output voltage.

9. The a-c current transformer of claim 6 wherein said electronic assist means further comprises a third winding magnetically coupled to said magnetic core; said third winding connected to said control means and terminated in a high-impedance manner so that a voltage signal across said third winding is approximately proportional to said rate of change of said magnetic flux; said control means further receiving said voltage signal and utilizing said voltage signal as a feedback signal for improved control of said magnetic flux, thereby further improving said accuracy of said current transformer.

10. A method for continuously providing a secondary alternating electric current that is approximately proportional to an alternating current component of a primary electric current; said primary electric current subject to also having a d-c current component; said method, comprising the steps of:

(a) providing a current transformer magnetic core having nonlinear permeance such that said magnetic core operates with high incremental permeance when said d-c current component is not present, thereby providing for current transformer operation with high accuracy when said d-c current component is not present; and said magnetic core operates in a non-saturated manner with reduced incremental permeance when said d-c current component is present, thereby providing current transformer operation with reduced accuracy when said d-c current component is present;

(b) provide a secondary winding wrapped around said magnetic core;

(c) terminate said secondary winding so that said secondary electric current can flow freely;

(d) cause said primary electric current to flow in a conductor configured as a primary winding of said current transformer; thereby causing said secondary alternating electric current to flow in said secondary winding.

11. The method of claim 10, wherein the step of providing said magnetic core further includes constructing said magnetic core with magnetic material having high permeability and providing a small gap across only part of said magnetic core, said gap comprising alternate material having lower permeability than said magnetic material; thereby causing said magnetic core to have said nonlinear permeance.

12. The method of claim 10 wherein the step of providing of said magnetic core further includes constructing said magnetic core with two kinds of magnetic material, a first magnetic material having high permeability and a second magnetic material having permeability that is lower than said first magnetic material, said first magnetic material being configured to provide a first closed magnetic path, and said second magnetic material being configured to provide a second closed magnetic path, thereby causing said magnetic core to have said nonlinear permeance.

13. The method of claim 10 further comprising the step of providing an electronic assist means for improving the accuracy of said current transformer.

14. The method of claim 13 wherein the step of providing an electronic assist further includes providing a voltage device connected in series with said secondary winding, a control means for controlling said voltage device, and a third winding magnetically coupled to said magnetic more; said third winding connected to said control means and terminated in a high-impedance manner so that a voltage signal across said third winding is approximately proportional to a rate of change of a magnetic flux in said magnetic core; said voltage device providing an output voltage which controls said rate of change of said magnetic flux; said control means receiving said voltage signal and controlling said voltage device so that changes of said magnetic flux are reduced, thereby improving said accuracy of said current transformer.

15. The method of claim 13 wherein the step of providing an electronic assist further includes providing a voltage device connected in series with said secondary winding, a control means for controlling said voltage device, and a sensing means for sensing said secondary electric current and providing an information signal to said control means; said voltage device providing an output voltage which controls a rate of change of a magnetic flux in said magnetic core; said control means receiving said information signal and controlling said voltage device so that changes of said magnetic flux are reduced, thereby improving said accuracy of said current transformer.

16. The method of claim 15 wherein the step of providing an electronic assist further includes providing a third winding magnetically coupled to said magnetic core; said third winding connected to said control means and terminated in a high-impedance manner so that a voltage signal across said third winding is approximately proportional to said rate of change of said magnetic flux; said control means further receiving said voltage signal and utilizing said voltage signal as a feedback signal for improved control of said magnetic flux, thereby further improving said accuracy of said current transformer.

* * * * *